United States Patent
Hellums et al.

(12) 
(10) Patent No.: US 6,208,277 B1
(45) Date of Patent: Mar. 27, 2001

(54) HIGH SPEED ANALOG TO DIGITAL CONVERSION CIRCUITRY USING QUANTUM MECHANICAL TUNNELING STRUCTURES

(75) Inventors: James R. Hellums, Plano, TX (US); Alan Seabeaugh, Granger, IN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/379,988

(22) Filed: Aug. 24, 1999

(51) Int. Cl.[7] ........................................ H03M 1/00
(52) U.S. Cl. ............................. 341/133; 341/136
(58) Field of Search ................... 341/133, 136, 341/155; 326/132, 133

(56) References Cited

U.S. PATENT DOCUMENTS

| | | | |
|---|---|---|---|
| 5,247,298 | * | 9/1993 | Wei et al. ........................ 341/133 |
| 5,789,940 | * | 8/1998 | Taddiken ............................ 326/60 |

* cited by examiner

*Primary Examiner*—Michael Tokar
*Assistant Examiner*—J J Lauture
(74) *Attorney, Agent, or Firm*—Mark E. Courtney; W. James Brady; Frederick J. Telecky, Jr.

(57) ABSTRACT

Analog to digital conversion circuitry (800) is disclosed, comprising multiple quantization circuits (802), having a quantization resistor (814, 816, 818, 820) coupled between inputs of adjacent quantization circuits, wherein each quantization circuit comprises an input source follower circuit (804) having an input coupled to an analog voltage input and an output, an output source follower circuit (812) having an input and an output coupled to a digital voltage output (822, 824, 826, 828), a base transistor (836) having a first terminal coupled to the output of said input source follower circuit, a reset transistor circuit (806) coupled to said first terminal and adapted to selectively ground said first terminal responsive to an external signal, a resonant tunneling diode structure (810) coupled at a first end to a second terminal of said base transistor and at a second end to ground, and a dynamic hysteresis loading circuit (808) coupled to a third terminal of said base transistor and to the input of said output source follower circuit.

21 Claims, 4 Drawing Sheets

HIGH SPEED ANALOG TO DIGITAL CONVERSION CIRCUITRY USING QUANTUM MECHANICAL TUNNELING STRUCTURES

This invention was made with Government support under Contract 95-C-4106. The Government may have certain rights in the invention.

TECHNICAL FIELD OF THE INVENTION

The present invention relates, in general, to logic circuitry used in electronic devices, and in particular, to high performance analog to digital (A/D) conversion circuitry designed with quantum mechanical tunneling structures.

BACKGROUND OF THE INVENTION

The continual demand for enhanced transistor and integrated circuit performance has resulted in improvements in existing devices, such as silicon, bipolar, and CMOS transistors and Galium Arsenide (GaAs) transistors, and also in the introduction of new device types and materials. In particular, scaling down device sizes to enhance high frequency performance leads to observable quantum mechanical effects, such as carrier tunneling through potential barriers. These effects led to development of alternative device structures which take advantage of such tunneling phenomenon; such as tunneling, and resonant tunneling, diodes and transistors. For ease of reference, all such structures are hereafter collectively referred to as tunneling diodes (TDs).

Tunneling diodes are generally two terminal devices with conduction carriers tunneling through potential barriers to yield current-voltage curves with portions exhibiting negative differential resistance (NDR). This negative differential resistance characteristic may be used as the basis for a wide range of high performance designs.

Conventionally, tunneling and resonant tunneling diodes have been limited in implementation to GaAs and other high performance processes. Conventional methods focused on building TDs in GaAs for several reasons; mainly because the speed characteristics and small process features of GaAs processes were conducive to tunneling mechanics. Since GaAs and other such processes were not practical or cost efficient for high-volume, consumer-related production, TDs have generally been limited in application to research and developmental applications.

Previously, feature sizes of standard silicon processes, such as CMOS, were not conducive to producing such tunneling structures. In the absence of commercially viable TDs, conventional CMOS circuit designs have utilized functional components readily available in CMOS processes. Conventional methods have focused on optimizing the design of these components individually, and improving their efficiency when utilized within larger circuits. As such, conventional CMOS circuitry does not comprehend the use of, nor enjoy the performance and system overhead improvements provided by circuitry implemented with TDs.

As performance demands have increased and feature sizes for CMOS processes have decreased, fabrication of tunneling structures in a production CMOS process becomes feasible. Tunnel diode growth on silicon is relatively immature. Recently, CMOS compatible tunnel diodes have been demonstrated to show that a wide range of current densities can be obtained; addressing requirements for imbedded memory and signal processing applications.

For a very high speed A/D design, the architecture and each component thereof must be capable of very high bandwidth. In general, the simpler the circuitry—the faster it can operate (i.e. at a higher bandwidth). This usually translates to designs that have as few nodes in the signal path as possible, and that utilize parallel paths for signal processing where possible. Additionally, use of components with inherently high bandwidth is required to achieve high speed performance desired.

Conventional analog-to-digital (A/D) converter designs utilizing tunneling diodes in high-performance processes (such as GaAs) have been designed based on performance characteristics peculiar to specific circuit components available in that process. Previous A/D converter designs suffer from a variety of performance limitations and, additionally, may not be readily adaptable to use in a CMOS process having tunneling structure capability.

To provide an illustration, a conventional A/D converter circuit 100 is shown in FIG. 1. Circuit 100 comprises four parallel processing assemblies, each representing a bit of the A/D code, divided by resistors 102, 104, and 106. A first assembly includes hetero-junction bipolar transistor (HBT) 108 coupled at its emitter to a series of four resonant tunneling diodes 110, the last of which couples to ground. The base of HBT 108 is coupled jointly to an input voltage $V_I$ and to a first end of resistor 102. A second end of resistor 102 couples to the base of HBT 112 which, in combination with a series of four resonant tunneling diodes 110 forms a second assembly, similar to the first. HBT 112 couples jointly at its base to a first end of resistor 104. Similarly, HBT 114 is intercoupled between resistors 104 and 106, and forms a third assembly with a series of four resonant tunneling diodes 110. Likewise, HBT 116 is intercoupled between resistors 106 and 118, and forms a fourth assembly with a series of four resonant tunneling diodes 110. Resistor 118 couples at its second end to ground, and has resistance value R.

The collector of HBT 108 couples jointly to a first end of load resistor 120 and a firstinput of comparator 122. A second end of load 120 couples to a supply voltage ($V_{cc}$), while a second input of comparator 122 is coupled to a reference voltage ($V_{REF}$). Comparator 122 outputs voltage $V_{O1}$. In similar fashion, HBT 112 is coupled to load 124 and comparator 126; with comparator 126 outputting voltage $V_{O2}$. Likewise, HBT 114 couple to load 128 and comparator 130, while HBT 116 couples to load 132 and comparator 134. Comparators 130 and 134 output voltages $V_{O3}$ and $V_{O4}$, respectively.

Resistor 102 has a value of 4R, resistor 104 a value of 2R, and resistors 106 and 118 values of R. The four parallel processing assemblies thus divide down $V_I$, and thereby render a least significant bit (LSB) through most significant bit (MSB) for A/D conversion. Additionally, the use of TDs in such a design efficiently provides a folding characteristic, when compared with other, much more elaborate, conventional designs. In theory, the base of HBT 108 will have $V_I$ applied, the base of HBT 112 will have $V_I/2$, the base of HBT 114 will have $V_I/4$, and the base of HBT 116 will have $V_I/8$.

However, conventional designs such as this suffer a variety of limitations. One such limitation is inherent in conventional architectures similar to circuit 100, and is illustrated in reference to FIG. 2. FIG. 2 represents a plot 200 of the output voltages $V_{O1}$–$V_{O4}$ of circuit 100 with respect to input voltage $V_I$. As $V_I$ increases, the four output voltages (representing the four bits of the converter) begin switching. By this design, when a maximum voltage is applied across HBT 108, for example, output $V_{O1}$ is low. Therefore, the digital information represented in FIG. 2 is a four bit inverted Gray-code representation of an input analog voltage $V_I$. Further processing of the resultant digital signals is therefore necessary to render a desired positive digital code. This requires additional circuitry, such as inverting buffers at the output of each comparator; which increases power dissipation and layout area, and decreases speed and overall efficiency of the A/D device.

Other limitations of conventional designs are inherent in the use of HBTs. Each HBT has an inherent offset voltage due to its base-to-emitter voltage ($V_{BE}$). Thus the voltage processed at the first bit of circuit 100 is actually ($V_I$-$V_{BE}$), not $V_I$. This level shift effect propagates down through each bit of the converter. The level shift has the effect of an offset in the reference voltage, causing errors. Additionally, if the $V_{BE}$ values of each bit aren't matched, non-linearity of the design will result. High speed HBTs have low beta values, which results in high base currents. Current leakage associated with those high base currents, as well as relatively large base currents required to operate the HBT at speed, can result reference voltage errors.

Conventional designs suffer from other design problems as well. Dynamic change of input impedances is characteristic of a design such as circuit 100, which can result in transient changes of bit voltages. Conventional designs required comparators to determine level changes for A/D functionality. Conventional comparators presented speed limitations; comparators capable of high speed operation presented size and power problems. Additionally, conventional designs lacked the ability to address the dynamic hysteresis of resonant tunneling diodes. This dynamic hysteresis introduced inconsistency into the A/D codes, which translated into non-linearity of the A/D device.

Therefore, high speed analog to digital conversion circuitry, incorporating quantum-mechanical tunneling structures, and readily usable in standard semiconductor processes (e.g. CMOS) as well as high-performance and hybrid processes (e.g. GaAs), is now needed; providing enhanced design performance and efficiency while overcoming the aforementioned limitations of conventional methods.

SUMMARY OF THE INVENTION

In the present invention, analog to digital (A/D) conversion circuitry is designed for use in semiconductor process including quantum mechanical tunneling structures; providing decreased circuit layout area, decreased power consumption, decreased operational errors and non-linearities, and increased operational speed over conventional designs. Negative differential resistance and current-voltage (I-V) characteristics of tunneling structures are exploited to provide high-performance A/D conversion.

In one embodiment of the present invention, a semiconductor device performing analog to digital conversion comprises an input buffer adapted to transceive an input voltage, a base transistor having a first terminal coupled to the input buffer and receiving input voltage therefrom, a reset circuit coupled to the first terminal and adapted to selectively ground that terminal, a quantum mechanical tunneling structure coupled at a first end to a second terminal of the base transistor and at a second end to ground, and a dynamic hysteresis loading circuit coupled to a third terminal of the base transistor and adapted to output a desired voltage from the semiconductor device.

Another embodiment of the present invention provides analog to digital conversion circuitry comprising multiple quantization circuits and having a quantization resistor coupled between inputs of adjacent quantization circuits, wherein each quantization circuit comprises an input source follower circuit having an input coupled to an analog voltage input and an output, an output source follower circuit having an input and an output coupled to a digital voltage output, a base transistor having a first terminal coupled to the output of the input source follower circuit, a reset transistor circuit coupled to the first terminal and adapted to selectively ground the first terminal responsive to an external signal, a resonant tunneling diode structure coupled at a first end to a second terminal of the base transistor and at a second end to ground, and a dynamic hysteresis loading circuit coupled to a third terminal of the base transistor and to the input of the output source follower circuit.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

Figure 1:
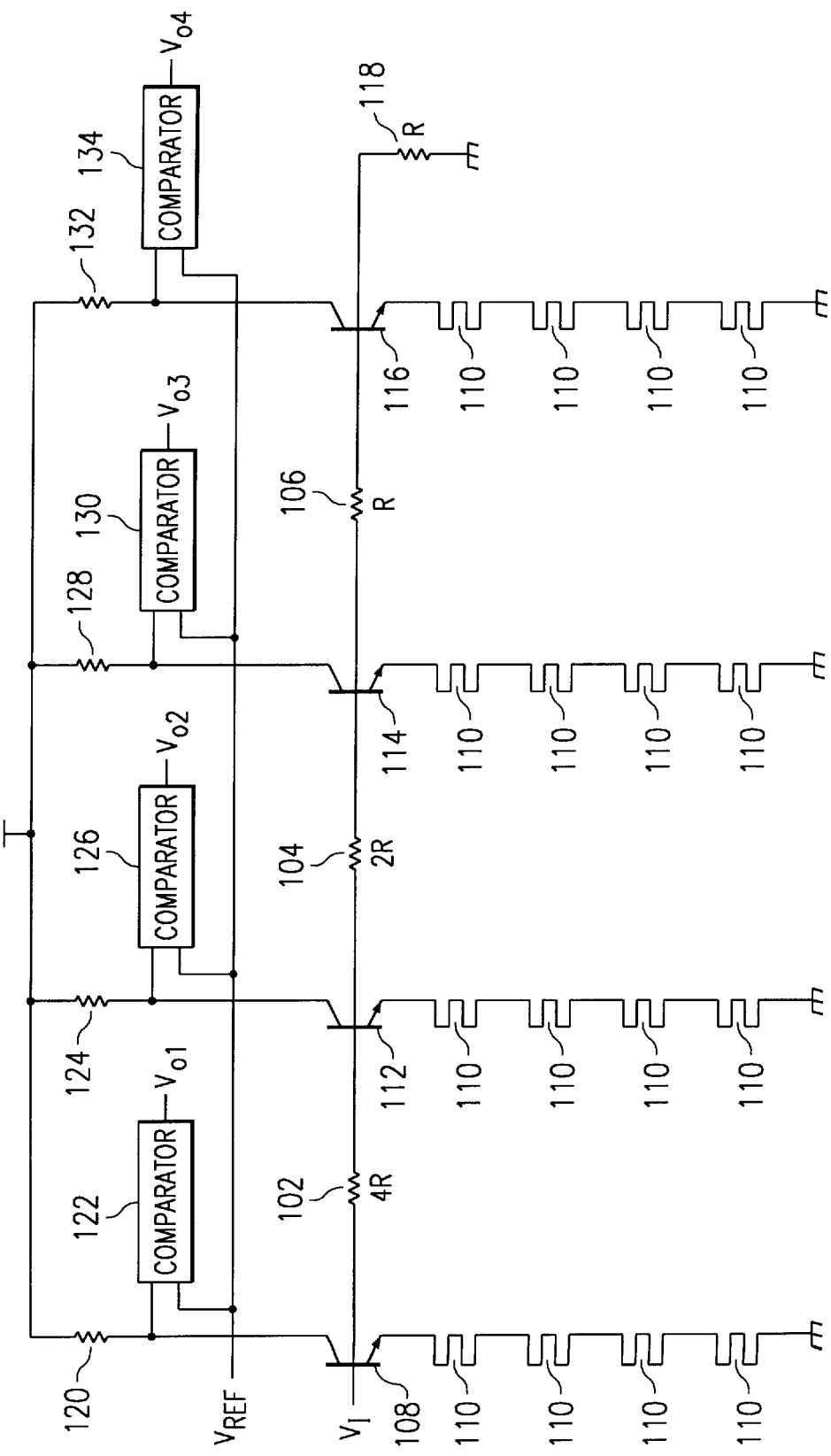
FIG. 1 is a schematic of a prior art A/D converter using resonant tunneling diodes.
Figure 2:
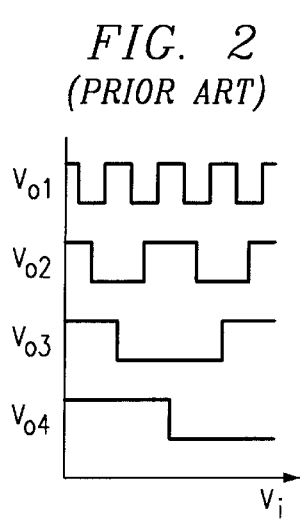
FIG. 2 is an illustrative graph of input and output voltage characteristics for the prior art A/D converter of FIG. 1.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention defines analog to digital (A/D) conversion circuitry employing quantum mechanical tunneling structures; providing increased device and system performance, and design optimization. The present invention provides reduced circuit complexity by decreasing the number and size of circuit components used. The present invention realizes a significant reduction in layout area, operational errors and non-linearities, and power consumption over conventional methods. Negative differential resistance (NDR) and current-voltage (I-V) characteristics of tunneling structures are exploited to provide high-performance A/D circuitry.

It should be understood that the principles and applications disclosed herein can be applied to A/D circuitry produced in a wide range of semiconductor process technologies. For purposes of explanation and illustration, the present invention is hereafter described in reference to CMOS and GaAs semiconductor processes. However, any process capable of forming a hetero-structures may be used to implement the present invention. For example, the present invention may be implemented in a InP-based process using: AlAs or AlGaAs barriers, GaAs wells on an InP base, and molecular beam epitaxy (MBE) production methods. Alternatively, the present invention may implemented in a CMOS process having silicon based tunneling diodes, using: Si wells, $SiO_2$ barriers, and either MBE or metal organic chemical vapor deposition (MOCVD) production methods.

For purposes of illustration, A/D conversion circuitry utilizing resonant tunneling diodes (RTDs) is disclosed. It should be understood, however, the principles and applications of the present invention are applicable to other quantum mechanical tunneling structures, such as Esaki ($p^+n^+$) diodes. RTDs are desirable for use in high speed circuitry due to the fact that their switching speed is generally faster than the more commonly-used structures available in semiconductor processes. RTDs are well-known for their intrinsic bi-stability and high-speed switching capability due to negative differential resistance (NDR) characteristics. High current density, low capacitance, and the NDR of RTDs make them very fast circuit elements. These same device characteristics can be exploited in high-speed, low-power, circuit applications.

Analog to digital conversion presents a designer with the challenge of converting a continuum of analog voltages (i.e. an infinite number of voltages) between two reference voltages into a finite and fixed range of digital codes. For example, a four (4) bit converter, having $2^4$ (=16) possible codes, will convert a voltage range between $V_{ref1}$ and $V_{ref2}$ into 16 voltage code ranges, each of magnitude $(V_{ref1}-V_{ref2})/16$. This process is known as quantization. One particularly desirable method of quantization is commonly known as folding. In folding converters, circuitry is designed such that the circuitry, based on its configuration and characteristics, inherently quantizes the analog input signal. RTDs are therefore superior for use in folding converters: their current-voltage characteristics are inherently quantizing, and they may be configured to provide folding conversion simply and efficiently.

Figure 3:
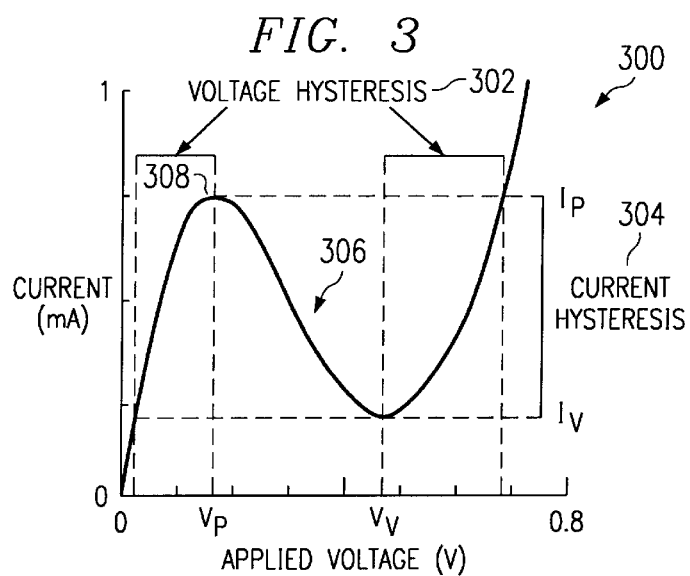
FIG. 3 is an illustrative graph of current-voltage characteristics of a resonant tunneling diode.
Figure 4A:
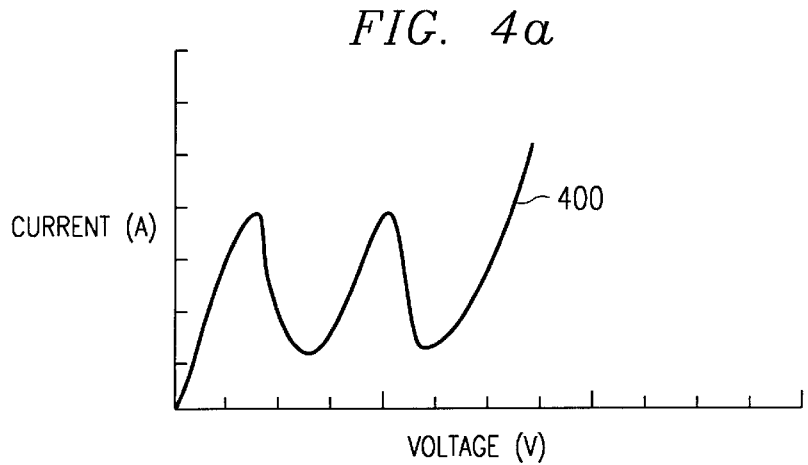
FIG. 4a is an illustrative graph of current-voltage characteristics of a series of resonant tunneling diodes.
Figure 4B:
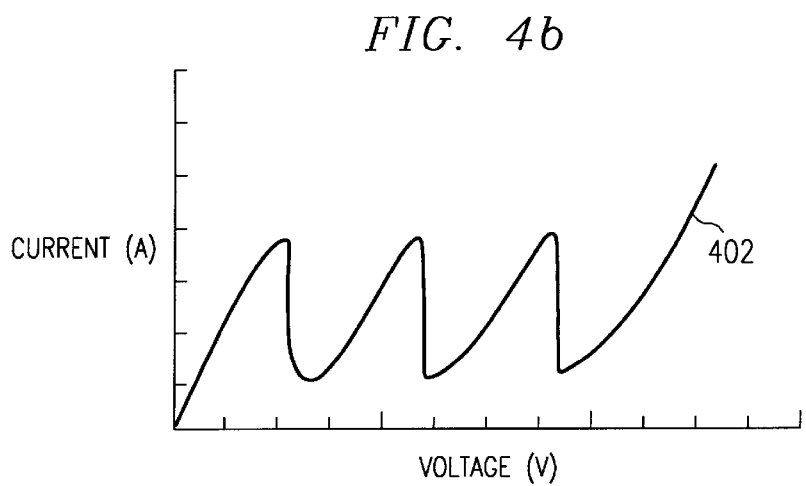
FIG. 4b is another illustrative graph of current-voltage characteristics of a series of resonant tunneling diodes.

These characteristics of RTDs are illustrated in FIGS. 3, 4a and 4b, to which reference is now made. FIG. 3 depicts an exemplary current-voltage (I-V) plot 300 of an typical RTD. As indicated, a typical RTD exhibits both voltage 302 and current 304 hysteresis. This results in an NDR region 306 in the curve following peak 308. An RTD can not be stably biased at voltages between the peak voltage $V_P$ and valley voltage $V_V$. If a plurality of RTDs are connected in series, as illustrated in FIGS. 4a and 4b, then the I-V plots for those series exhibit a peak for each RTD in the series. As an example, FIG. 4a illustrates an I-V plot 400 for two RTDs in series, having two peaks. Similarly, FIG. 4b illustrates an I-V plot 402 for three RTDs in series, having three peaks. Such curves also exhibit the same number of NDR regions as there are RTDs in a series.

Figure 5:
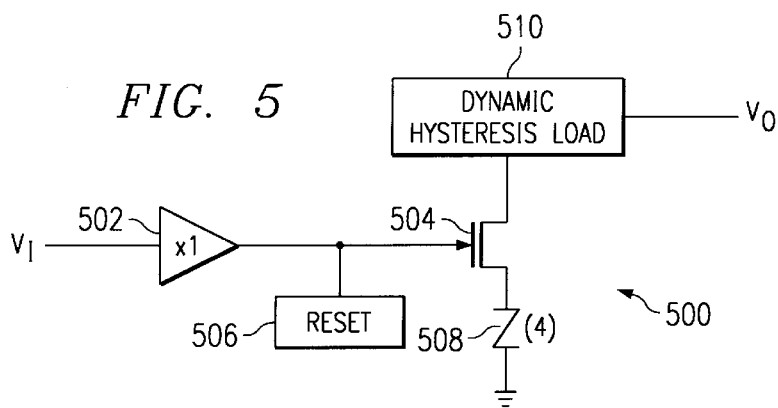
FIG. 5 is a schematic illustrating one embodiment of a bit quantizing circuit according to the present invention.

Referring now to FIG. 5, a single bit quantizing circuit 500 according to the present invention is illustrated. Circuit 500 receives an input voltage, $V_I$, into a unity gain buffer 502. The output of buffer 502 is coupled to the gate of a base field effect transistor (FET) 504, as is reset circuit 506. In a preferred embodiment, FET 504 is a heterostructure FET (HFET). Alternatively, a depletion NMOS or a natural NMOS transistor may be used in a semiconductor process having RTDs. The source of FET 504 is coupled to a series 508 of four (4) RTDs. The series 508 is coupled at its other end to ground. The drain of FET 504 is coupled to a dynamic hysteresis load 510. FET 504 functions to ensure that the full $V_I$ is applied across series 508; without level shifting or $V_{BE}$ loss. Reset circuit 506 addresses the dynamic hysteresis of series 508, overcoming the non-linearity limitations of conventional designs. Since dynamic hysteresis is inherent in RTD structures, and structural alteration of RTDs is not feasible, the undesirable effects (e.g. non-linearity) of RTD on the output codes must be addressed via reset circuitry. Reset circuit 506 is implemented to reset a dynamic point, forcing the voltage across series 508 to zero, resetting RTD thresholds back to the beginning of their I-V curves, and thereby ensuring that circuit 500 always sweeps up while processing an input voltage $V_I$. Circuit 500 then outputs output voltage $V_O$ from load 510.

Figures 6A, 6B, 7:
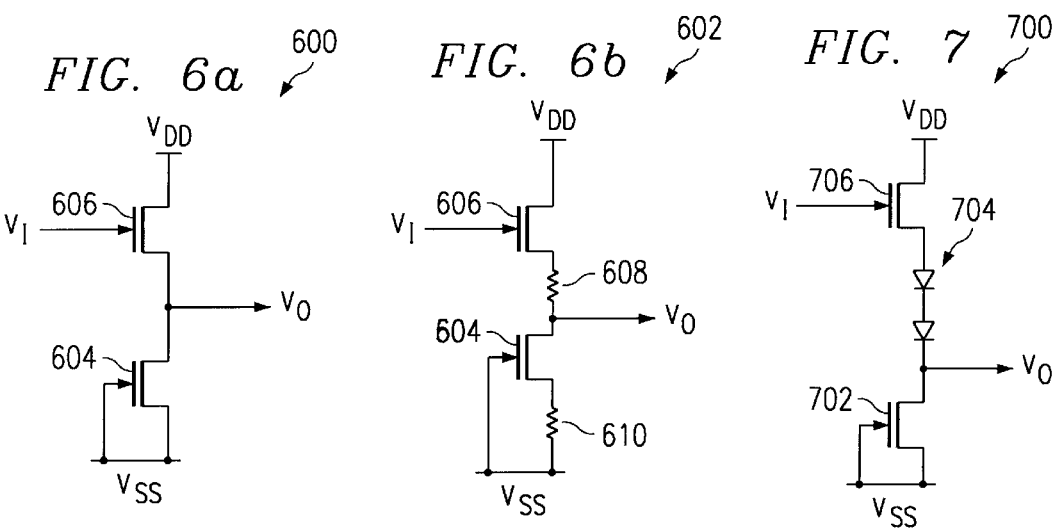
FIG. 6a is a schematic illustrating one embodiment of an input buffer according to the present invention.
FIG. 6b is a schematic illustrating a preferred embodiment of an input buffer according to the present invention.
FIG. 7 is a schematic illustrating one embodiment of an output buffer according to the present invention.

Buffer 502 may be realized by a variety of designs including, for example, source follower implementations using HFET technology. Two exemplary HFET source follower circuits, circuit 600 and circuit 602, are illustrated in FIGS. 6a and 6b, respectively. In FIG. 6a, circuit 600 is formed with FETs 604 and 606 in a follower topology. FET 604 has its gate and source coupled to a first supply voltage ($V_{SS}$), and its drain coupled jointly to the output of circuit 600 and the source of FET 606. The input of circuit 600 is coupled to the gate of FET 606, while the drain of FET 606 couples to a second supply voltage ($V_{DD}$). Referring now to FIG. 6b, circuit 602 modifies the follower topology of circuit 600 slightly, with the addition of resistors 608 and 610. Again, FET 604 has its gate coupled to $V_{SS}$. Resistor 610 couples the source of FET 604 to $V_{SS}$, while the drain of FET 604 couples jointly to the output of circuit 602 and a first end of resistor 608. Resistor 608 is coupled at its other end to the source of FET 606. The input of circuit 602 is coupled to the gate of FET 606, while the drain of FET 606 couples to $V_{DD}$.

HFETs are depletion-mode, n-channel devices having pinch-off voltages ($V_P$) on the order of −0.5 volts. Since HFETs are depletion-mode devices, d.c. voltage levels in circuit 600 will be ($V_I=V_O$) if FET 604 is a constant current source. If, however, the output conductance of FET 604 is not constant, then the gate-source voltage ($V_{GS}$) of FET 606 will change as the d.c. level of the input changes. This is because the current in FET 604 will change due to channel length modulation (i.e. large output conductance). Hence, if FETs 604 and 606 are matched in size and have long channel (gate) lengths, then circuit 600 will suffice. Thus, offset and level shift limitations of conventional methods are overcome.

Despite overcoming the limitations of previous methods, circuit 600 will operate at less than optimal speed, especially when compared to devices designed with minimum gate lengths. Minimum gate length devices deliver optimal speed, but typically have higher output conductance, rendering them poor current sourcing devices. Circuit 602 of FIG. 6b overcomes this issue with the addition of resistors 608 and 610. Resistor 610 creates negative feedback on FET 604, which decreases its output conductance and thereby renders it a capable current source. FETs 604 and 606 may therefore be minimum gate length devices, optimizing speed performance. Resistor 608 is added for balancing with resistor 610. FETs 604 and 606, and resistors 608 and 610, are implemented such that the $V_{GS}$ of FET 604 matches that of FET 606 and the voltage drops across resistors 608 and 610 are equal. Thus, d.c. level shift from $V_I$ to $V_O$ is zero.

At the output of each quantizer bit circuit 500, magnitude of an output voltage signal may be less than that of the power supply voltage. As such, a digital buffer circuit may be added to drive subsequent digital logic or memory circuitry. A variety of buffer circuits will suffice. One embodiment of the present invention comprises use of a follower circuit 600. This variation would be suitable for use with a CMOS-based semiconductor process. Another embodiment of the present invention comprises use of a level-shifted source follower, for use where subsequent circuitry requires level-shifting. Such an embodiment is illustrated in FIG. 7, a level-shifted voltage follower circuit 700.

Circuit 700 comprises FET 702, which has its gate and source coupled to $V_{SS}$. The drain of FET 702 couples jointly to the output of circuit 700 and a first end of diode pair 704. Diode 704 couples at its other end to the source of FET 706. The input of circuit 700 is coupled to the gate of FET 706, while the drain of FET 706 couples to $V_{DD}$.

Figure 8:
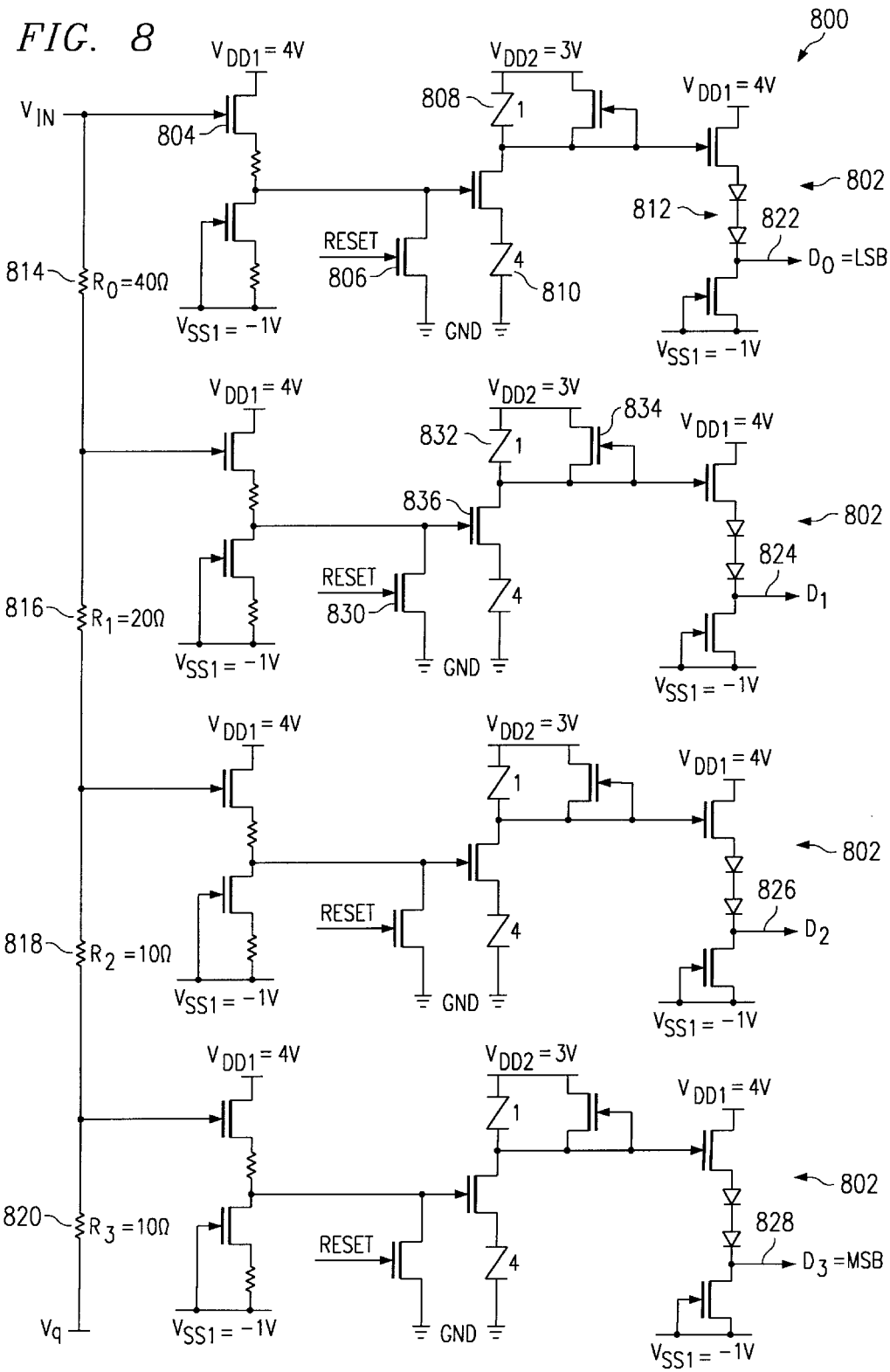
FIG. 8 is a schematic illustrating one embodiment of a four-bit analog to digital conversion circuit according to the present invention.

Referring now to FIG. 8, a preferred embodiment of a four (4) bit converter circuit 800 is illustrated. Circuit 800 comprises four bit quantizing circuits 802, as previously disclosed in relation to FIG. 5, in parallel. Each bit circuit 802 comprises input buffer circuitry 804, reset circuitry 806, dynamic hysteresis load circuitry 808, RTD series 810, and an optional output buffer circuit 812. Resistor 814 intercouples the voltage input of a first circuit 802 to the voltage input of a second circuit 802. Similarly, resistor 816 intercouples voltage inputs of the second and third circuits 802; and resistor 818 intercouples voltage inputs of the third and fourth circuits 802. Resistor 820 couples the voltage input of the fourth circuit 802 to a reference voltage ($V_q$). Circuit 800 has four digital outputs 822–828, that output data bits $D_0$–$D_3$, respectively. In this embodiment, output 822 outputs the least significant bit (LSB) $D_0$, while output 828 outputs the most significant bit (MSB) $D_3$. Also in this embodiment, $V_q$ is set to equal half of the LSB voltage (LSB/2), which is approximately equal to 0.075 volts. For this embodiment, resistors 818 and 820 have a value of 10 ohms. Resistor 816 is 20 ohms, while resistor 814 is 40 ohms. Thus $V_I$ is applied to the voltage input of first circuit 802, ($V_I/2$) to second circuit 802, ($V_I/4$) to third circuit 802, and ($V_I/8$) to fourth circuit 802. As should be apparent to those skilled in the art, any resistor values may be selected to provide desired voltage taps at each bit circuit input.

Buffer 804 is a follower circuit as disclosed in reference to FIG. 6b. Reset circuit 806 comprises an HFET 830 coupled to ground, and adapted to reset voltage across RTD series 810 to zero upon an appropriate reset input. A preferred embodiment of dynamic hysteresis circuit 808 comprises an RTD 832 and an HFET 834. A first end of RTD 832 is coupled jointly to the drain of HFET 836 and the output buffer 812. If buffer 812 is not implemented, then an output 822, 824, 826, or 828 would be coupled to instead of buffer 812. RTD 832 couples at its second end to a supply voltage $V_{DD2}$. HFET 834 has its gate and source jointly coupled to the first end of RTD 832. The drain of HFET 834 couples to $V_{DD2}$.

The combination of RTD 832 and HFET 834 provides high-speed comparison and loading functionality; yielding positive (i.e. non-inverted) code. RTD 832 functions, in conjunction with series 810, as a high-speed comparator. As configured, RTD 832 provides a complementing I-V characteristic to each of the RTDs in series 810; such that as series 810 sweeps through $V_I$, the transition of each RTD in series 810 forces RTD 832 to its threshold, signaling a "1". HFET 834 provides passive loading and establishes a bias point for operation of series 810. This configuration thus provides non-inverting comparator functionality using only small and fast RTD and HFET structures, thus overcoming the aforementioned limitations of conventional methods.

Figure 9:
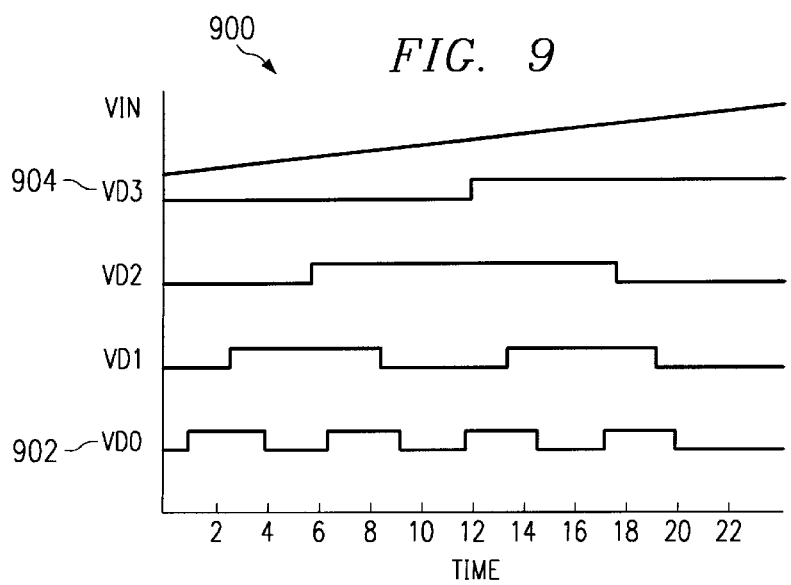
FIG. 9 is an illustrative graph of input and output voltages of the circuit shown in FIG. 8.

An exemplary input and output plot for circuit 800 is illustrated in FIG. 9. Plot 900 shows input voltage ($V_{IN}$) and the resultant voltage waveforms for outputs D0–D3. Waveform 902 represents the voltage for LSB D0; while waveform 904 represents the voltage for MSB D3. As should be apparent, the conversion of $V_{IN}$ from analog to digital renders a non-inverting, positive digital code.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. In reference to FIG. 8, for example, one may eliminate some of the unutilized RTDs from series 810 in the second, third, and fourth bit circuits 802; as each RTD in the series is not utilized in sweeping the divided down input voltages. While this is possible, the embodiment shown in FIG. 8 is preferred to provide dynamic impedance matching and overall circuit stability. Additionally, series RTDs are generally vertical process structures; rendering the lateral die space consumed by one RTD equivalent to that consumed by two, three, or four RTDs. As disclosed, a variety of buffer and reset circuits may be employed within the scope of the present invention. Although the present invention is illustrated in reference to resonant tunneling diodes, other quantum mechanical tunneling structures exhibiting similar characteristics may be utilized. Further, the principles of the present invention are practicable in a number of process technologies. It is therefore intended that the appended claims encompass any such modifications or embodiments.

What is claimed is:

1. A semiconductor device performing analog to digital conversion, said device comprising:
   an input buffer to transceive an input voltage;
   a base transistor having a first terminal coupled to said input buffer and receiving said input voltage therefrom;
   a reset circuit coupled to said first terminal to selectively ground said first terminal;
   a quantum mechanical tunneling structure coupled at a first end to a second terminal of said base transistor and at a second end to ground; and
   a dynamic hysteresis loading circuit coupled to a third terminal of said base transistor to output a desired voltage from said device.

2. The device of claim 1 wherein said base transistor is a field effect transistor, and wherein said first terminal is the gate thereof, said second terminal is the source thereof, and said third terminal is the drain thereof.

3. The device of claim 2 wherein said field effect transistor is a heterostructure field effect transistor.

4. The device of claim 2 wherein said field effect transistor is an n-channel metal oxide semiconductor field effect transistor.

5. The device of claim 2 wherein said field effect transistor is a depletion mode n-channel metal oxide semiconductor field effect transistor.

6. The device of claim 1 wherein said reset circuit selectively grounds said first terminal responsive to an external signal, and wherein said reset circuit further comprises:

a transistor with a first terminal to receive said external signal;

a second terminal coupled to ground; and a third terminal coupled to the first terminal of said base transistor.

7. The device of claim 6 wherein said field effect transistor is a heterostructure field effect transistor.

8. The device of claim 1 wherein said input buffer further comprises a source follower circuit.

9. The device of claim 8 wherein said source follower circuit comprises a plurality of heterostructure field effect transistors.

10. The device of claim 9 wherein said source follower circuit further comprises:

a first transistor having its gate and source coupled to a first voltage source, and its drain coupled to the first terminal of said base transistor; and a second transistor having its source coupled to the first terminal of said base transistor, its drain coupled to a second voltage source, and its gate to receive said input voltage.

11. The device of claim 9 wherein said source follower circuit further comprises:

a first transistor having its gate coupled to a first voltage source, and its drain coupled to the first terminal of said base transistor;

a first resistor intercoupling the source of said first transistor and said voltage source;

a second transistor having its drain coupled to a second voltage source, and its gate to receive said input voltage; and a second resistor intercoupling the source of said second transistor and the first terminal of said base transistor.

12. The device of claim 1 further comprising an output buffer to level-shift said desired voltage from said dynamic hysteresis loading circuit for use by a subsequent circuit receiving output from said device.

13. The device of claim 12 wherein said output buffer further comprises a source follower circuit.

14. The device of claim 13 wherein said source follower circuit comprises a plurality of heterostructure field effect transistors.

15. The device of claim 14 wherein said source follower circuit further comprises:

a first transistor having its gate and source coupled to a first voltage source, and its drain coupled to an output of said device; and a second transistor having its source coupled to said output of said device, its drain coupled to a second voltage source, and its gate coupled to an output of said dynamic hysteresis loading circuit.

16. The device of claim 14 wherein said source follower circuit further comprises:

a first transistor having its gate and source coupled to a first voltage source, and its drain coupled to an output of said device;

a second transistor having its drain coupled to a second voltage source and its gate coupled to an output of said dynamic hysteresis loading circuit; and a diode structure intercoupling the source of said second transistor and said output of said device.

17. The device of claim 1 wherein said device is produced in a complementary metal oxide semiconductor process.

18. The device of claim 1 wherein said device is produced in an Indium Phosphide (InP)-based semiconductor process.

19. The device of claim 1 wherein said quantum mechanical tunneling structure comprises a resonant tunneling diode.

20. The device of claim 1 wherein said quantum mechanical tunneling structure comprises a plurality of resonant tunneling diodes coupled in series.

21. Analog to digital conversion circuitry comprising multiple quantization circuits, having a quantization resistor coupled between inputs of adjacent quantization circuits, wherein each quantization circuit comprises:

an input source follower circuit having an input coupled to an analog voltage input and an output;

an output source follower circuit having an input, and an output coupled to a digital voltage output;

a base transistor having a first terminal coupled to the output of said input source follower circuit;

a reset transistor circuit coupled to said first terminal to selectively ground said first terminal responsive to an external signal;

a resonant tunneling diode structure coupled at a first end to a second terminal of said base transistor and at a second end to ground; and a dynamic hysteresis loading circuit coupled to a third terminal of said base transistor and to the input of said output source follower circuit.

* * * * *